(12) United States Patent
Nakamura

(10) Patent No.: US 8,451,019 B2
(45) Date of Patent: May 28, 2013

(54) METHOD OF DETECTING FAILURE AND MONITORING APPARATUS

(75) Inventor: Daiya Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 349 days.

(21) Appl. No.: 12/845,850

(22) Filed: Jul. 29, 2010

(65) Prior Publication Data

US 2011/0187404 A1  Aug. 4, 2011

(30) Foreign Application Priority Data

Jul. 30, 2009 (JP) ................................ 2009-178129

(51) Int. Cl.
 *G01R 31/40* (2006.01)
 *G06F 1/26* (2006.01)

(52) U.S. Cl.
 USPC ..................................... 324/764.01; 713/300

(58) Field of Classification Search
 None
 See application file for complete search history.

(56) References Cited

U.S. PATENT DOCUMENTS

| | | | | |
|---|---|---|---|---|
| 6,646,981 | B1 * | 11/2003 | Kinouchi et al. | 714/14 |
| 6,781,807 | B2 * | 8/2004 | Loechner | 361/92 |
| 7,131,013 | B2 | 10/2006 | Sasakura et al. | |
| 7,504,849 | B2 * | 3/2009 | Ohshima | 324/764.01 |
| 7,825,799 | B2 * | 11/2010 | Takahashi et al. | 340/540 |
| 2006/0133181 | A1 | 6/2006 | Amano | |
| 2008/0082849 | A1 * | 4/2008 | Takahashi et al. | 340/636.11 |
| 2008/0155133 | A1 | 6/2008 | Honjo et al. | |
| 2010/0060293 | A1 * | 3/2010 | Rochard | 324/537 |

FOREIGN PATENT DOCUMENTS

| | | |
|---|---|---|
| JP | 4-125716 A | 4/1992 |
| JP | 2002-034177 A | 1/2002 |
| JP | 2005-301476 A | 10/2005 |
| JP | 2006-172403 A | 6/2006 |
| JP | 2008-158799 A | 7/2008 |

OTHER PUBLICATIONS

Partial English-language translation of Japanese Office Action mailed Jun. 28, 2011 for corresponding Japanese Application No. 2009-178129.

* cited by examiner

*Primary Examiner* — Jermele M Hollington
(74) *Attorney, Agent, or Firm* — Fujitsu Patent Center (57) ABSTRACT

A method of detecting a failure in an information processing apparatus is provided. The method includes detecting at least one of a power supply failure and a unit failure, monitoring the detected unit failures, and determining a detected unit failure for a first unit is erroneous if the monitoring indicates another of the units receiving power from a same power supply system as the first unit has also detected a unit failure. The power supply failure indicates a failure associated with a power supply system affecting more than one of the units, and the unit failure indicates a failure of one of the units.

6 Claims, 7 Drawing Sheets

METHOD OF DETECTING FAILURE AND MONITORING APPARATUS

CROSS-REFERENCE TO RELATED APPLICATION

This application is related to and claims the benefit of priority to Japanese Patent Application No. 2009-178129, filed on Jul. 30, 2009, the entire contents of which are incorporated herein by reference.

FIELD

Embodiments discussed herein relate to a method of detecting a failure, by which a failure of a power supply unit is detected, and to a monitoring apparatus.

BACKGROUND

A power supply unit (PSU) performs processing, such as rectification, voltage reduction, etc., on an input voltage, and supplies a stable power supply voltage suitable for various kinds of units, such as a hard disk drive (HDD), etc., in an apparatus to which the PSU pertains. The PSU handles a high voltage current, and thus if a failure occurs in the PSU, heat might be generated, or an abnormality might occur in the power supply voltage which is supplied to each of the units in the apparatus. This might result in failures of the individual units. In order to avoid these problems, a PSU has a function of independently monitoring its own state all the time, and performing degeneration processing by itself immediately if the PSU has detected a failure. Stated differently, in a conventional system the PSUs are not collectively monitored. Rather each PSU only monitors itself.

In this manner, typical functions of the PSU include a function of converting an input voltage into a stable power supply voltage suitable for each unit in the apparatus, a function of monitoring a state of the PSU itself and performing degeneration processing by itself immediately at failure detection time, and a function of detecting occurrence of a power failure and informing a unit in the apparatus of the power failure.

In a RAID (Redundant Array of Independent Disks) apparatus, which is an example of a large-scale storage apparatus, a plurality of controller units and a plurality of HDD units are connected through a network in order to maintain expandability and redundancy, and to perform communication among the individual units so that a coordinated operation as one unit of a storage apparatus is performed.

Figure 1:
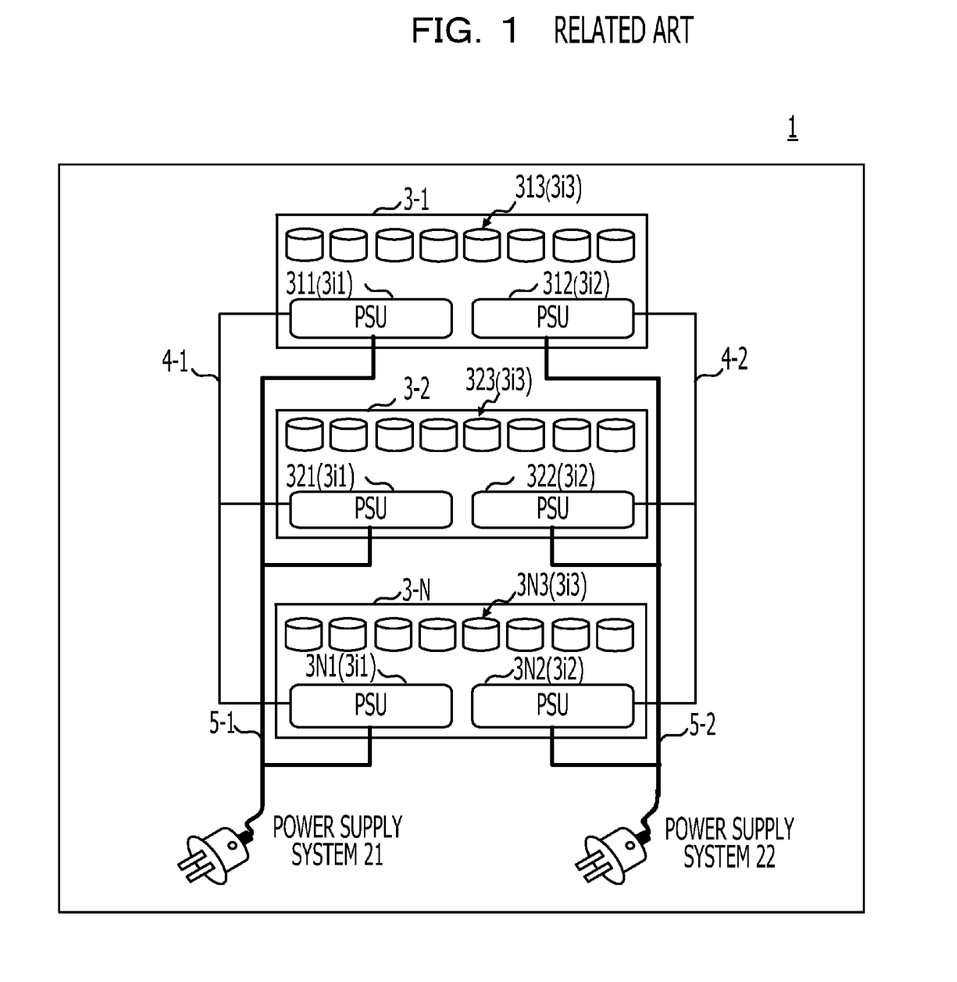
FIG. 1 illustrates an example of a configuration of a RAID apparatus.

FIG. 1 illustrates an example of a configuration of a RAID apparatus. In the RAID apparatus 1 illustrated in FIG. 1, HDD units 3-1 to 3-N (N is a natural number of two or more) are connected through networks 4-1 and 4-2, respectively. Each HDD unit 3-i (i=1 to N) has two PSUs 3i1 and 3i2, and a plurality of HDDs 3i3. For example, the HDD unit 3-1 has two PSUs 311 and 312, and a plurality of HDDs 313.

One of the PSUs 311 to 3N1 of the individual HDD units 3-1 to 3-N convert an input voltage obtained from a first power supply system 21 through a power cable 5-1 to a suitable power supply voltage, and supply the voltage to individual sections in the HDD units 3-1 to 3-N. Also, the other of the PSUs 312 to 3N2 of individual HDD units 3-1 to 3-N convert an input voltage obtained from a second power supply system 22 through a power cable 5-2 to a suitable power supply voltage, and supply the voltage to the individual sections in the HDD units 3-1 to 3-N.

In this manner, in the individual HDD units 3-1 to 3-N, the PSUs are duplicated (or made redundant), and thus even if one of the PSUs fails, it is possible to supply a power voltage from the other of the PSUs. Accordingly, even if one the PSUs fails, and degeneration processing is performed by the failed PSI, it is possible to continue operation by the RAID apparatus 1 as a whole. For example, if a power failure occurs in the first power supply system 21 in FIG. 1, it becomes impossible for one of the PSUs 311 to 3N1 to supply a power voltage. However, if the power supply system 22 is normal, the other of the PSUs 312 to 3N2 may supply a power voltage to individual sections in the HDD units 3-1 to 3-N, and thus it becomes possible to perform normal operation as the RAID apparatus 1.

The individual PSUs monitor an input voltage, and detect a power failure. However, for a special power failure in which an input voltage temporarily becomes unstable, there are cases where a power failure is not detected. Also, the PSU may not be able to perform voltage conversion normally because of an unstable input voltage. In this case, the PSU may determine that a failure has occurred within the PSU itself, and perform degeneration processing.

Figure 2:
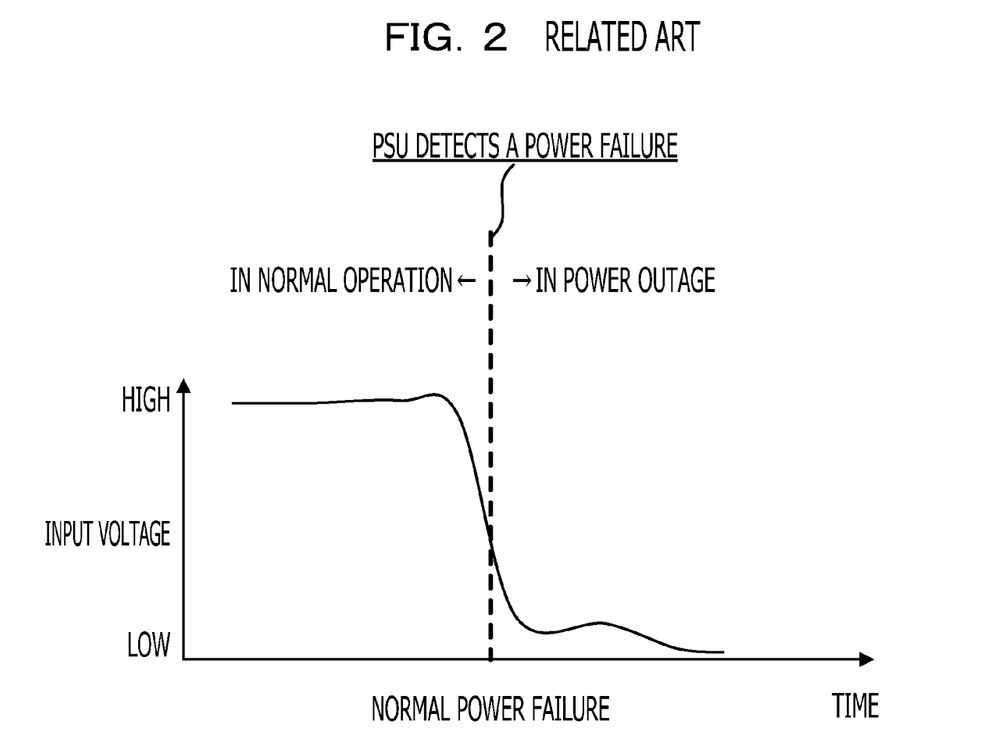
FIG. 2 illustrates an example change in an input voltage resulting from a normal power failure at a normal power failure time.
Figure 3:
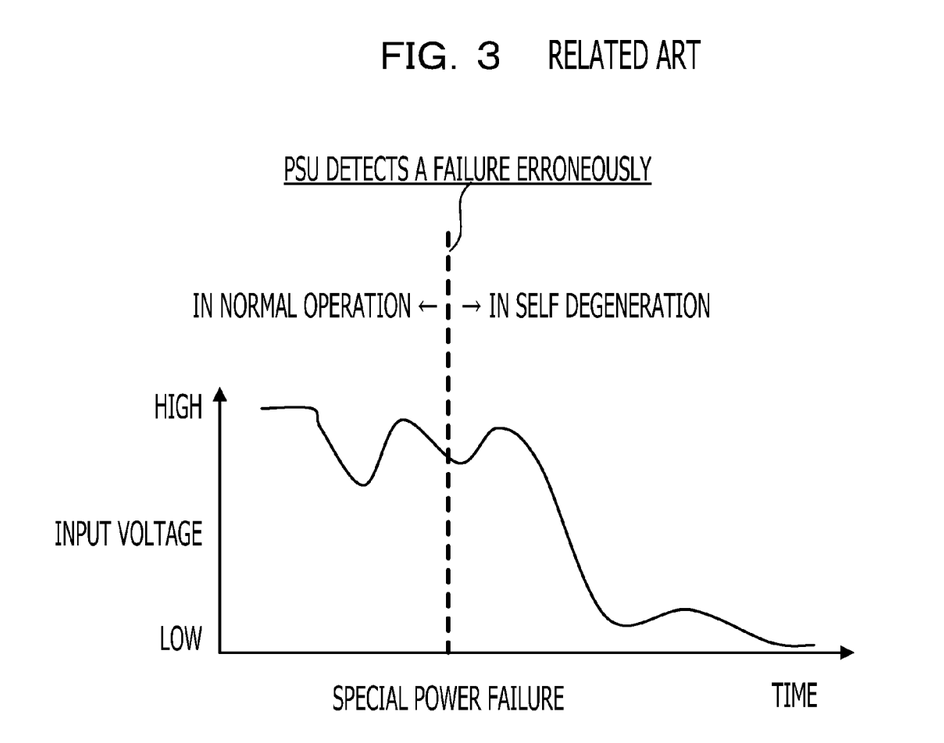
FIG. 3 illustrates an example change in an input voltage resulting from a special power failure at a special power failure time.

FIG. 2 is a diagram illustrating an example change in an input voltage resulting from a normal power failure at a normal power failure time. FIG. 3 is a diagram illustrating an example change in an input voltage resulting from a special power failure at a special power failure time. In FIGS. 2 and 3, the vertical axis shows input voltage from the power supply system to the PSU in any units, and the horizontal axis shows time in any units.

As shown in FIG. 2, it is possible for the PSU to detect a normal power failure in which an input voltage suddenly drops to a certain potential. That is to say, if the input voltage drops to a certain potential within a certain time period, the PSU detects a power failure, for example.

However, for example, as shown in FIG. 3, if an input voltage becomes unstable for a certain period of time, and it takes a longer time than a certain period of time for the input voltage to drop to a certain potential, the PSU may not be able to perform normal voltage conversion because of the unstable input voltage. If the PSU cannot perform normal voltage conversion of the input voltage, the PSU may detect its own failure. However, in reality, the reason inhibiting or preventing the performance of the normal voltage conversion is a special power failure, and the PSU itself has not failed in the case of FIG. 3, for example. However, using conventional techniques, the PSU may determines that the PSU itself has failed, and the PSU may perform degeneration processing. Accordingly, until the PSU that has performed degeneration processing by itself is repaired or replaced, it is not possible to use the RAID apparatus 1 in a state of redundant PSUs.

SUMMARY

According to an aspect of the invention, a method of detecting a failure in an information processing apparatus that includes a plurality of units is provided. The method includes detecting at least one of a power supply failure and a unit failure, the power supply failure being a failure associated with a power supply system affecting more than one of the plurality of units, and the unit failure being a failure of one of the plurality of units; monitoring the detected unit failures; and determining a detected unit failure for a first unit of the plurality of units is an erroneous detection if the monitoring indicates another of the plurality of units receiving power from a same power supply system as the first unit has also detected a unit failure.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

In a disclosed method of detecting a failure and monitoring apparatus, in an apparatus including a plurality of units having redundant power supply systems, a monitoring apparatus makes a determination on the basis of the state of each of the PSUs. For example, if erroneous detection of a failure occurs in a power supply unit (PSU), which is caused by an input voltage from a power supply system, the monitoring apparatus detects an erroneous detection of a failure rather than a failure in the PSU on the basis of the situation of the entire apparatus and the states of the individual PSUs.

In the following, a description is provided of a disclosed method of detecting a failure and monitoring apparatus according to each embodiment with reference to the drawings.

Figure 4:
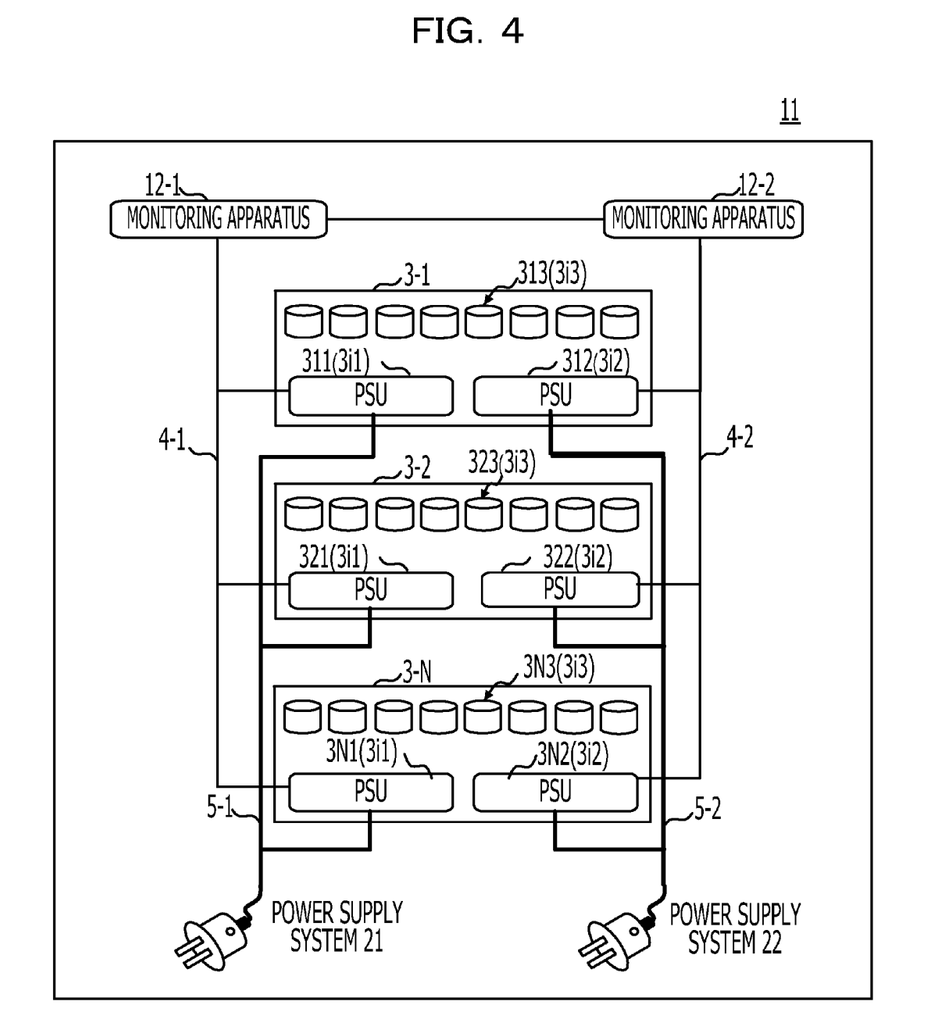
FIG. 4 illustrates an example of a configuration according to an embodiment.

FIG. 4 illustrates an example of a configuration according to an embodiment of the present invention. In this example, a case of implementation using a RAID apparatus is shown. In FIG. 4, same reference numerals are given to same sections as those shown in FIG. 1.

In the RAID apparatus 11 illustrated in FIG. 4, monitoring apparatuses 12-1 and 12-2 and HDD units 3-1 to 3-N (N is a natural number of two or more) are connected through networks 4-1 and 4-2. Each of the monitoring apparatuses 12-1 and 12-2 may be formed by a well-known general-purpose computer including a storage section (e.g., memory, etc.) storing programs and data, and a processor (e.g., a CPU, etc.) which executes the programs. Each of the HDD units 3-i (i=1 to N) has two PSUs 3i1 and 3i2, and a plurality of HDDs 3i3. For example, the HDD unit 3-1 has two PSUs 311 and 312, and a plurality of HDDs 313.

One of the PSUs 311 to 3N1 of the individual HDD units 3-1 to 3-N convert an input voltage obtained from a first power supply system 21 through a power cable 5-1 into a suitable power supply voltage, and supply the voltage to individual sections in the HDD units 3-1 to 3-N. Also, the other of the PSUs 312 to 3N2 of the individual HDD units 3-1 to 3-N convert an input voltage obtained from a second power supply system 22 through a power cable 5-2 into a suitable power supply voltage, and supply the voltage to the individual sections in the HDD units 3-1 to 3-N. Also, at least one of the PSUs 311 to 3N1 of the individual HDD units 3-1 to 3-N are monitored by a monitoring apparatus 12-1 through the network 4-1. Also, at least one of the other of the PSUs 312 to 3N2 of the individual HDD unit 3-1 to 3-N are monitored by a monitoring apparatus 12-2 through the network 4-2. The monitoring apparatus 12-1 receives a failure detection notification or a power failure detection notification from one of the PSUs 311 to 3N1 of the individual HDD units 3-1 to 3-N through the network 4-1. The monitoring apparatus 12-2 receives a failure detection notification or a power failure detection notification from one of the PSUs 312 to 3N2 of the individual HDD units 3-1 to 3-N through the network 4-2.

In this manner, in the individual HDD units 3-1 to 3-N, the PSUs are duplicated (or made redundant), and thus even if one of the PSUs fails, it is possible to supply a power voltage from the other of the PSUs. Accordingly, even if one the PSUs fails, and degeneration processing is performed by failed PSU, it is possible to continue operation by the RAID apparatus 1 as a whole. For example, if a power failure occurs in the first power supply system 21 in FIG. 4, it may become impossible for one of the PSUs 311 to 3N1 to supply a power supply voltage. However, if the power supply system 22 is normal, the other of the PSUs 312 to 3N2 may supply a power supply voltage to individual sections in the HDD units 3-1 to 3-N, and thus normal operation as the RAID apparatus 1 may be continued. In this regard, the redundancy of the PSUs is not limited to duplication. It goes without saying that one of the PSUs may be disposed for each of the three power supply systems or more in each HDD unit, for example.

As described with reference to FIG. 3, if a special power failure, in which an input voltage becomes unstable for a certain period of time, and it takes a longer time than a certain period of time for the input voltage to drop to a certain potential, occurs, although the PSU itself has not failed, the PSU may determine that the PSU itself has failed, and perform degeneration processing by itself. The PSU itself generally cannot determine whether the detected failure is an erroneous detection or not. However, a power failure including a special power failure is caused by the power supply system 21 or the power supply system 22 outside of the RAID apparatus 11. And, a plurality of the HDD units 3-1 to 3-N in the RAID apparatus 11 are generally affected by the special power failure. Accordingly, in the present embodiment, the monitoring apparatuses 12-1 and 12-2, which may monitor multiple or all the HDD units 3-1 to 3-N in the RAID apparatus 11, can determine whether a power failure has occurred or not, that is to say, whether a failure of the PSU is an erroneous detection or not.

Figure 5:
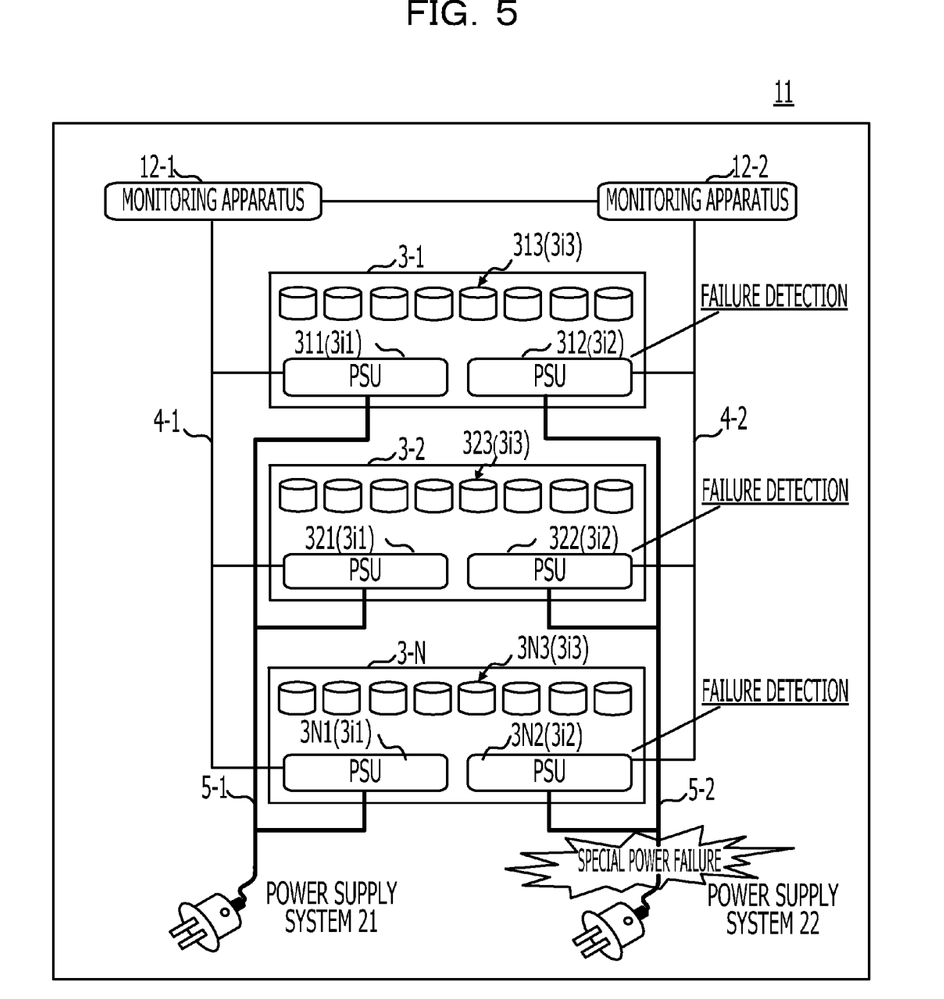
FIG. 5 illustrates an example of failure detection according to the embodiment.

FIG. 5 illustrates an example of failure detection in the embodiment. In FIG. 5, same reference numerals are given to same sections as those shown in FIG. 4, and the description thereof will be omitted.

FIG. 5 illustrates an example of the occurrence of a special power failure in the second power supply system 22. In this case, it is assumed that a plurality of the PSUs have detected the failure among the PSUs 3-1 to 3-N pertaining to the same second power supply system 22. However, the probability that failures occur in a plurality of the PSUs at the same time in short period of time is low, and thus it is possible for the monitoring apparatus 12-2 to determine that the failure detected by a plurality of the PSUs is an erroneous detection of a failure, which has been caused by a power failure of the second power supply system 22.

Figure 6:
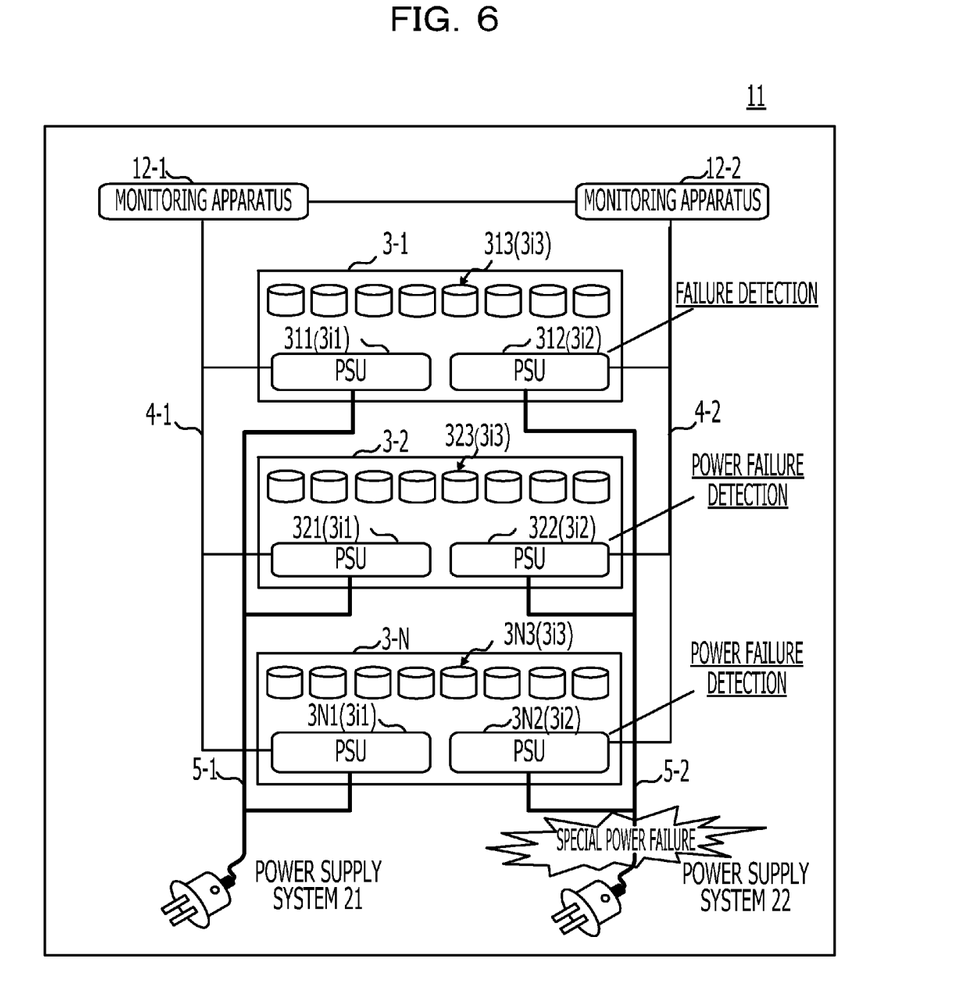
FIG. 6 illustrates another example of failure detection according to the embodiment.

FIG. 6 illustrates another example of failure detection in the embodiment. In FIG. 6, same reference numerals are given to same sections as those shown in FIG. 4, and the description thereof will be omitted.

FIG. 6 illustrates an example of the occurrence of a special power failure in the second power supply system 22. In this case, it is assumed that for example, the PSU 312 has detected a failure and a plurality of the other PSUs (for example, the PSUs 322 and 3N2) have detected power failures among the PSUs 3-1 to 3-N pertaining to the same second power supply system 22. However, the probability that one PSU 312 has detected a failure, and at the same time, a plurality of the PSUs have detected power failures is low, and thus it is possible for the monitoring apparatus 12-2 to determine that the failure detected by the PSU 312 is an erroneous detection, which has been caused by a power failure of the second power supply system 22.

Figure 7:
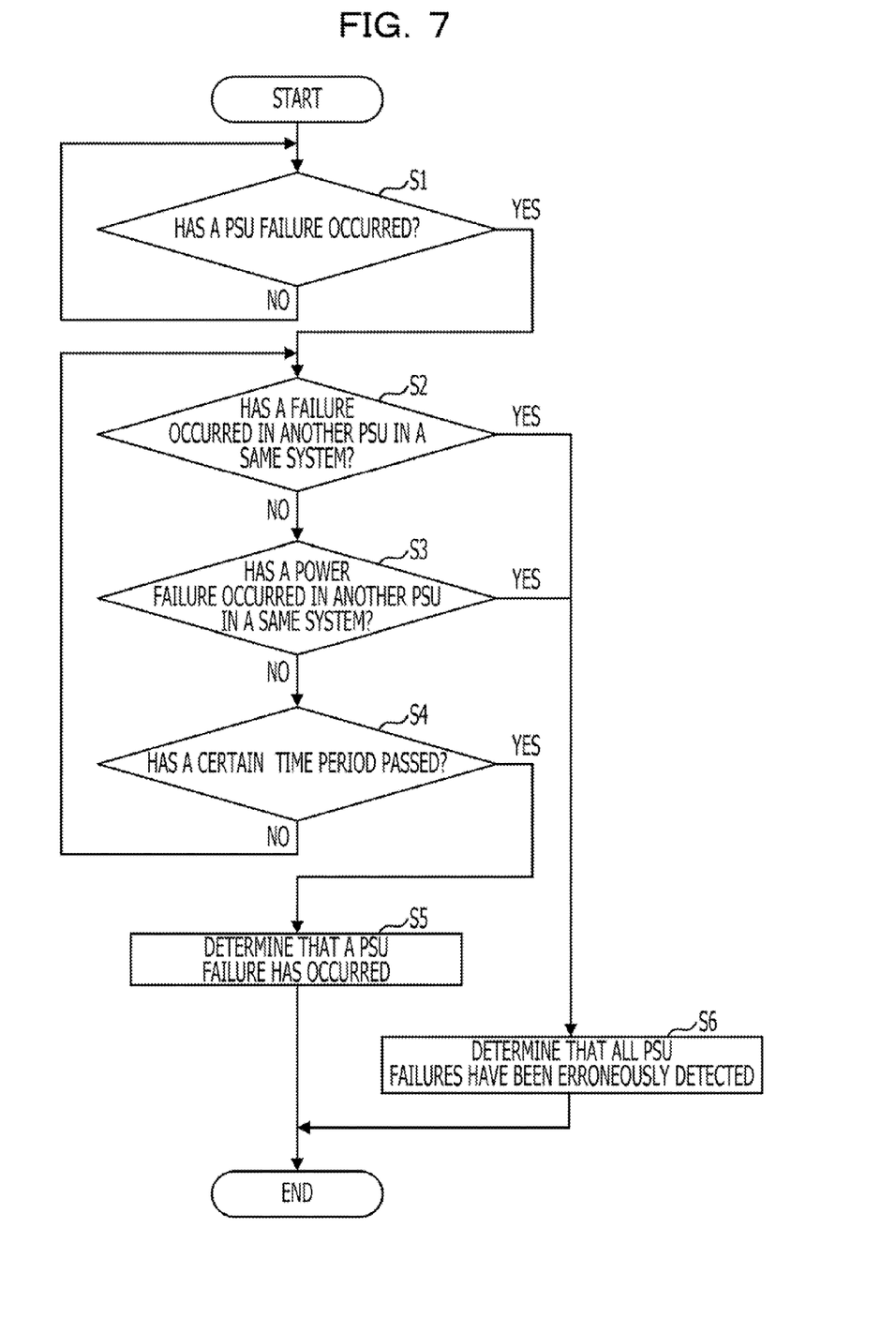
FIG. 7 is a flowchart illustrating operation of the embodiment.

FIG. 7 is a flowchart illustrating operation of the embodiment. The erroneous-failure-detection determination processing shown in FIG. 7 may be performed by the individual monitoring apparatuses 12-1 and 12-2, for example. Specifically, the processor forming the monitoring apparatus executes an erroneous-failure-detection determination program stored in the storage section so that the erroneous-failure-detection determination processing is performed. The erroneous-failure-detection determination processing executed by the monitoring apparatus 12-1 for the individual PSUs 311 to 3N1 of the HDD units 3-1 to 3-N is the same as the erroneous-failure-detection determination processing executed by the monitoring apparatus 12-2 for the individual PSUs 312 to 3N2 of the HDD units 3-1 to 3-N. Thus, for the convenience of description, a description is provided for only the erroneous-failure-detection determination processing executed by the monitoring apparatus 12-2.

Referring to FIG. 7, in S1, a determination is made on whether a failure has occurred in any PSU among all the HDD units 3-1 to 3-N in the RAID apparatus 11. To put it another way, whether or not a PSU itself has detected a failure of the PSU itself on the basis of whether there has been a failure detection notification from any of the PSUs is determined. For example, as shown in FIG. 3, in the case where an input voltage from the power supply system becomes unstable for a certain period of time, and it takes a long time for the input voltage to drop to a certain potential; normal voltage conversion may not be able to be performed because of the unstable input voltage. In the case of not being allowed to perform voltage change because of a failure, and further in the case where an internal temperature of a PSU has risen to a certain temperature, the individual PSUs determine that a failure has occurred by a well known method. It is possible to determine whether voltage conversion is performed normally or not by, for example, a detection circuit in the PSU determining whether a voltage produced after the voltage conversion of the input voltage is a certain potential or more. If the voltage produced after the voltage conversion of the input voltage is less than a certain potential, it may be determined that the voltage conversion is not normally performed. Also, it is possible to determine whether the internal temperature of the PSU has increased to a certain temperature or not by a temperature sensor disposed in the PSU or in the vicinity of the PSU determining whether the detected temperature is higher than a certain temperature or not.

If the determination result in S1 is YES, in S2, a determination is made on whether a failure has occurred in the other one of or plurality of the PSUs, which are being supplied with power supply voltages from the same power supply system as that of any PSU that has sent a failure detection notification, and there has been a failure detection notification or not. If the determination result in S2 is NO, in S3, on the basis of whether there has been a power failure detection notification from the other one or a plurality of the PSUs, a determination is made on whether a power failure has occurred in one or a plurality of the PSUs other than the any PSU, which are being supplied with a power supply voltage from the same power supply system as that of any PSU that has sent a failure detection notification. For example, as shown in FIG. 2, if the input voltage has dropped to a certain potential within a certain time period, the individual PSUs determine that a power failure has occurred by a well-known method. It is possible to determine whether an input voltage from a power supply system has dropped to a certain potential within a certain time period by, for example, a detection circuit in the PSU.

If the determination result in S3 is NO, in S4, a determination is made on whether a certain period of time has passed or not. It is possible to determine whether a certain period of time has passed or not by a well-known method using a hardware timer in the PSU or a software timer. If the determination result in S4 is NO, the processing returns to S2. On the other hand, if the determination result in S4 is YES, in S5, it is determined that any PSU from which a failure has been detected in S1 has actually failed, and the erroneous-failure-detection determination processing is terminated.

Also, if the determination result in either S2 or S3 is YES, in S6, a determination is made that a failure of any PSU that has been detected in S1, and a failure (or a power failure detected in S3) of one or a plurality of the PSUs other than the any PSU being supplied with a power supply voltage from the same power supply system as that of the any PSU which has been detected in S2, that is to say, all the other PSUs (for example, the PSUs 312 to 3N2) being supplied with a power supply voltage from the same power supply system as that of the any PSU are erroneous failure detection, and the erroneous-failure-detection determination processing is terminated. In this regard, it is possible to recover the PSUs by resetting all the PSUs which are supplied with a power supply voltage from the same power supply system as that of the PSU that has been determined to have erroneous failure detection in S6 by a well-known method.

In this manner, by the above-described embodiment, although the PSUs have a function of detecting a failure of the PSU itself and a function of detecting a power failure, the monitoring apparatus that is monitoring the entire RAID apparatus determines whether a failure detected by a PSU is erroneous detection or not. Thus, it becomes possible to determine erroneous detection of a failure easily and with high precision using a monitoring apparatus. For example, if a failure detected by a PSU is actually caused by a special power failure, in which voltage conversion is not being performed normally, and the PSU itself has not failed, the monitoring apparatus determines that the PSU itself has not failed. Thus, even if the PSU itself erroneously detects a failure, the PSU does not perform degeneration processing by itself. Accordingly, after the cause of a power failure is removed, it is possible to use the RAID apparatus in a redundant state without repairing or replacing the PSU having detected the failure erroneously.

In the above-described embodiment, the present invention is applied to a RAID apparatus. However, the present invention is not limited to a RAID apparatus, and is applied to any apparatus having a plurality of units with redundant power supply systems. That is to say, the plurality of units with redundant power supply systems are not limited to storage apparatuses, such as HDD units, etc. In summary, the present invention is not particularly limited to a specific apparatus as long as the apparatus includes a monitoring apparatus which determines that erroneous detection of a failure of a power supply unit (PSU), which is caused by an input voltage from a power supply system, is not actually a failure of a PSU, but is erroneous detection of a failure from the situation of the entire apparatus on the basis of the individual PSU states. All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The invention claimed is:

1. A method of detecting a failure in an information processing apparatus that includes a plurality of units, the method comprising:

detecting at least one of a power supply failure and a unit failure, the power supply failure being a failure associated with a power supply system affecting more than one of the plurality of units, and the unit failure being a failure of one of the plurality of units;

monitoring the detected unit failures; and determining a detected unit failure for a first unit of the plurality of units is an erroneous detection if the monitoring indicates another of the plurality of units receiving power from a same power supply system as the first unit has also detected a unit failure, the plurality of units are a plurality of power supply units, and the detecting detects a unit failure when a potential after voltage conversion by a power supply unit receiving a power supply voltage from a power supply system is less than a certain potential.

2. The method of detecting a failure according to claim 1, wherein the detecting detects a unit failure when an internal temperature of one of the plurality of units has risen to or above a certain temperature.

3. The method of detecting a failure according to claim 1, wherein the potential after the voltage conversion becomes less than the certain potential in the case where the power supply voltage from the power supply system becomes unstable for a certain period of time, and it takes longer time than a certain period of time for the power supply voltage to drop to or below the certain potential.

4. A monitoring apparatus monitoring a plurality of units being supplied with power supply voltages from power supply systems through power supply units comprising:

a receiving unit to receive at least one of a power supply failure notification and a unit failure notification, the power supply failure notification indicating a failure of a power supply system, and the unit failure notification indicating a failure of one of the power supply units; and a monitoring unit to collectively monitor the power supply units based on the received unit failure notifications and to determine a received unit failure notification indicating a unit failure for a first power supply unit is an erroneous detection if the monitoring unit indicates that another unit failure notification has been received for a second power supply unit receiving power from a same power supply system as the first power supply unit, the unit failure notification indicates that a potential after voltage conversion of a power supply voltage from any one of the power supply systems is less than a certain potential.

5. The monitoring apparatus according to claim 4, wherein the unit failure notification indicates that an internal temperature of one of the power supply units has risen to or above a certain temperature.

6. The monitoring apparatus according to claim 4, wherein the potential after the voltage conversion becomes less than the certain potential in the case where the power supply voltage from any one of the power supply systems becomes unstable for a certain period of time, and it takes longer time than a certain period of time for the power supply voltage to drop to or below the certain potential.

* * * * *